(12) United States Patent
Shemesh

(10) Patent No.: US 7,683,317 B2
(45) Date of Patent: Mar. 23, 2010

(54) METHOD AND SYSTEM FOR DETECTING HIDDEN DEFECTS

(75) Inventor: Dror Shemesh, Hod Hasharon (IL)

(73) Assignee: Applied Materials Israel, Ltd., Rehovot (IL)

( * ) Notice: Subject to any disclaimer, the term of this patent is extended or adjusted under 35 U.S.C. 154(b) by 455 days.

(21) Appl. No.: 11/532,465

(22) Filed: Sep. 15, 2006

(65) Prior Publication Data
US 2007/0114404 A1 May 24, 2007

Related U.S. Application Data

(60) Provisional application No. 60/728,580, filed on Oct. 20, 2005.

(51) Int. Cl.
*H01J 40/00* (2006.01)
*H01J 47/00* (2006.01)
(52) U.S. Cl. .................. 250/305; 250/307; 250/310; 250/492.2; 250/492.22; 250/492.3; 250/397; 430/5; 430/311; 430/312; 703/6; 703/13; 716/19; 716/21; 356/237.5
(58) Field of Classification Search .............. 250/305, 250/307, 310, 492.2, 492.22, 492.3, 397; 430/5, 311, 312; 703/6, 13; 716/19, 21; 356/237.5; 850/5–10
See application file for complete search history.

(56) References Cited

U.S. PATENT DOCUMENTS 6,627,886 B1 * 9/2003 Shachal et al. ............... 850/9

* cited by examiner

*Primary Examiner*—Jack I Berman
*Assistant Examiner*—Meenakshi S Sahu
(74) *Attorney, Agent, or Firm*—Sonnenschein Nath & Rosenthal LLP

(57) ABSTRACT

A method for detecting hidden defects and patterns, the method includes: receiving an object that comprises an opaque layer positioned above an intermediate layer; defining an energy band in response to at least one characteristic of the opaque layer and at least one characteristic of a scanning electron microscope; illuminating the object with a primary electron beam; and generating images from electrons that arrive to a spectrometer having an energy within the energy band. A scanning electron microscope that includes a stage for supporting an object that comprises an opaque layer positioned above an intermediate layer; a controller, adapted to receive or define an energy band in response to at least one characteristic of the opaque layer and at least one characteristic of a scanning electron microscope; illumination optics adapted to illuminate the object with a primary electron beam; an electron spectrometer, controlled by the controller such as to selectively reject electrons in response to the defined energy band; and a processor, coupled to the spectrometer, adapted to generate images from detection signals provided by the spectrometer.

19 Claims, 7 Drawing Sheets

METHOD AND SYSTEM FOR DETECTING HIDDEN DEFECTS

RELATED APPLICATION

This application claims the priority of U.S. provisional patent application Ser. No. 60/728,580, filed on Oct. 20, 2005.

FIELD OF THE INVENTION

The invention relates to scanning electron microscopes and especially to a devices and method for detecting hidden defects.

BACKGROUND OF THE INVENTION

Integrated circuits are very complex devices that include multiple layers. Each layer may include conductive material and/or isolating material while other layers may include semi-conductive materials. These various materials are arranged in patterns, usually in accordance with the expected functionality of the integrated circuit. The patterns also reflect the manufacturing process of the integrated circuits.

Integrated circuits are manufactured by complex multi-staged manufacturing processes. This process may include depositing resistive material on a substrate or layer, selectively exposing the resistive material by a photolithographic process, and developing the resistive material to produce a pattern that defines some areas to be later etched or otherwise processed. After the pattern is processed various materials, such as copper are disposed. The deposition step is usually followed by a removing access material. Copper is polished by mechanical means, while other materials can be polished by chemical processes and/or a combination of chemical as well as mechanical processes. The polishing can result in various deformation, such as dishing and erosion.

Copper is sensitive to oxidation, therefore, some of the manufacturers protects the copper layer by a dedicated protective layer that is deposited over copper, after the copper was deposited and/or polished. Usually this layer is made of materials such as Silicon Nitride and Silicon Carbide.

By applying the protection layer various manufacturing process can be executed in a more relaxed manner.

Various metrology, inspection and failure analysis techniques evolved for inspecting integrated circuits both during the manufacturing stages, between consecutive manufacturing stages, either in combination with the manufacturing process (also termed "in line" inspection techniques) or not (also termed "off line" inspection techniques). It is known that manufacturing failures may affect the electrical characteristics of the integrated circuits. Some of these failures result from unwanted deviations from the required dimensions of the patterns.

Electron beam metrology and defect detection tools, such as Scanning Electron Microscopes are used for high resolution measurement of surface features as well as surface defects and contaminations. These tools generate a spot of electrons that is very small. Typical spots may have a diameter of about few nanometers. The electron beam spot interacts with the surface and with a certain volume that is positioned near to the surface.

A typical protective layer is much thicker then the depth of the effective information volume of a typical Scanning Electron Microscope. For example, a protective layer can be few tens nanometers (typically 50 to 100 nm), while the depth of the effective information volume of a typical SEM is about few nanometers.

Accordingly, the typical Scanning Electron Microscope can not view defects that are below the protective layer.

There is a need to provide methods and systems for imaging of sub-surface layers, detecting hidden defects, and especially defects positioned below a protective layer.

SUMMARY OF THE INVENTION

A method for detecting hidden defects, the method includes: receiving an object that comprises an opaque layer positioned above an intermediate layer; defining an energy band in response to at least one characteristic of the opaque layer and at least one characteristic of a scanning electron microscope; illuminating the object with a primary electron beam; and generating images from electrons that arrive to a spectrometer having an energy within the energy band.

A scanning electron microscope that includes a stage for supporting an object that comprises an opaque layer positioned above an intermediate layer; a controller, adapted to receive or define an energy band in response to at least one characteristic of the opaque layer and at least one characteristic of a scanning electron microscope; illumination optics adapted to illuminate the object with a primary electron beam; an electron spectrometer, controlled by the controller such as to selectively reject electrons in response to the defined energy band; and a processor, coupled to the spectrometer, adapted to generate images from detection signals provided by the spectrometer.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE DRAWINGS

The invention relates to systems and methods for detecting hidden defects.

The inventors found that traditional scanning electron microscope microscopes do not image an intermediate layer that is positioned beneath the protective layer due to the due to the short mean free path of electrons. The mean free path is responsive to various parameters such as the depth (in relation of the upper surface of the protective layer) of the location from which the secondary electron was omitted.

The mean free path depends upon the material from which the protective layer is made of (especially on the energy of the electrons that are exited by the primary beam of the scanning electron microscope. It can also depend upon the kinetic energy of the primary electron beam.

For a given material, the mean free path has a minimum at electron energies of about 50V. The mean free path increases as the electron energy is much smaller and much larger that about 50 eV.

Figure 1:
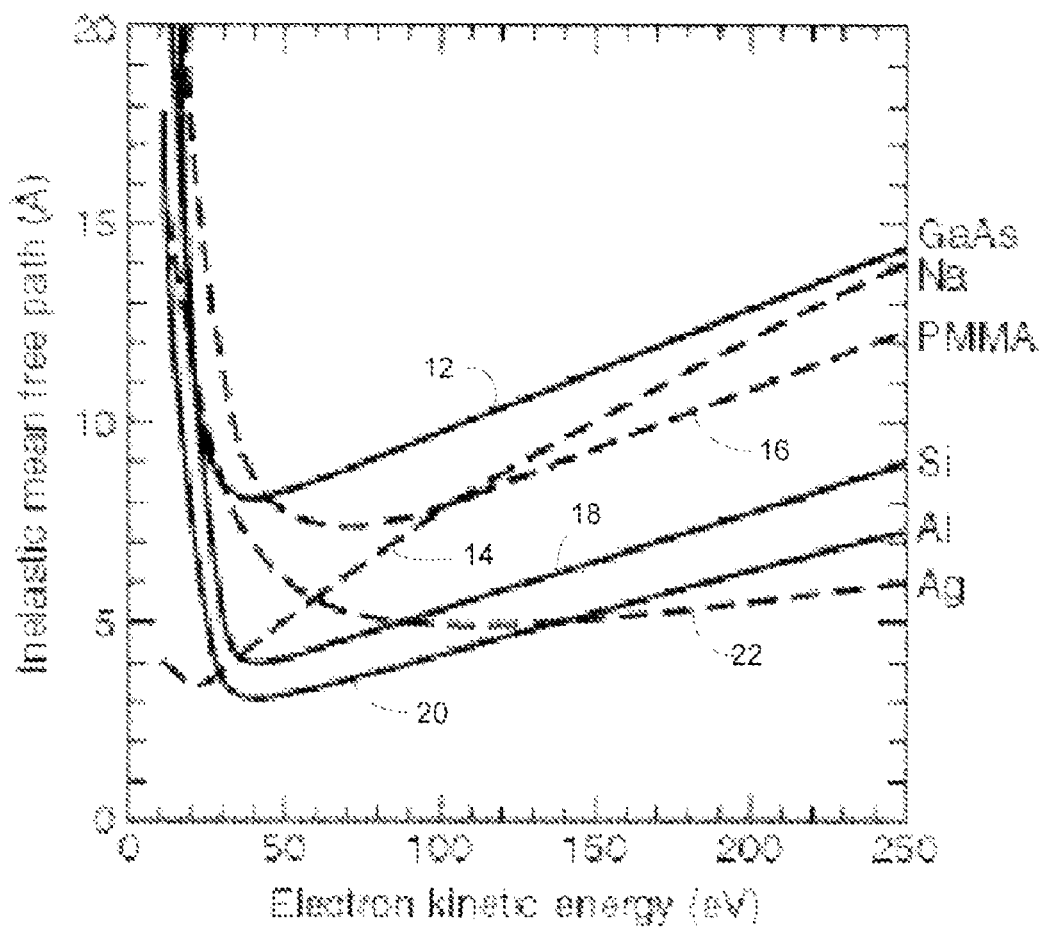
FIG. 1 illustrates interaction process between a sample and a beam of charged particles as well as various information volumes.

FIG. 1 illustrates the relationship between mean free path and electron energy, in various materials. These relationships are illustrated by curves 10-22. Each curve is related to a different material.

Electrons that have energies of about 50 eV convey information from substantially the upper surface of the protective layer. High-energy electrons (having a certain energy that exceeds a upper electron threshold that is responsive to the material from which the protective layer is made of) convey information about the intermediate layer that is positioned below the protective layer. In addition, secondary electrons that have very low energies can convey information about the intermediate layer.

A Scanning electron microscope generates images of an object under test from secondary electrons that are scattered/omitted from the inspected object. The image is formed from secondary electrons that have various energies, including high-energy electrons (typically limited by the energy of the primary electron beam directed towards the object), low energy electrons (even those having almost zero electron volts) and very low energy electrons.

Most of the secondary electrons that form the image are low energy electrons. The information that is carried by fewer high-energy electrons is masked by the information that is carried by the majority (low energy) secondary electrons.

The inventors found out that an image of the intermediate layer (especially the upper surface of the intermediate layer) can be generated by filtering out low-energy electrons. The energy threshold that is set by the filter can be defined in advance, in response to gathered images and the like. This energy threshold will usually depend upon the material from which the protective layer is made, from its thickness and the like.

According to an embodiment of the invention the energy filtering is implemented in a scanning electron microscope that separated between the primary electron beam and the secondary electron beam, such that the filtering of the secondary electron beam does not substantially affect the primary electron beam.

Figure 2:
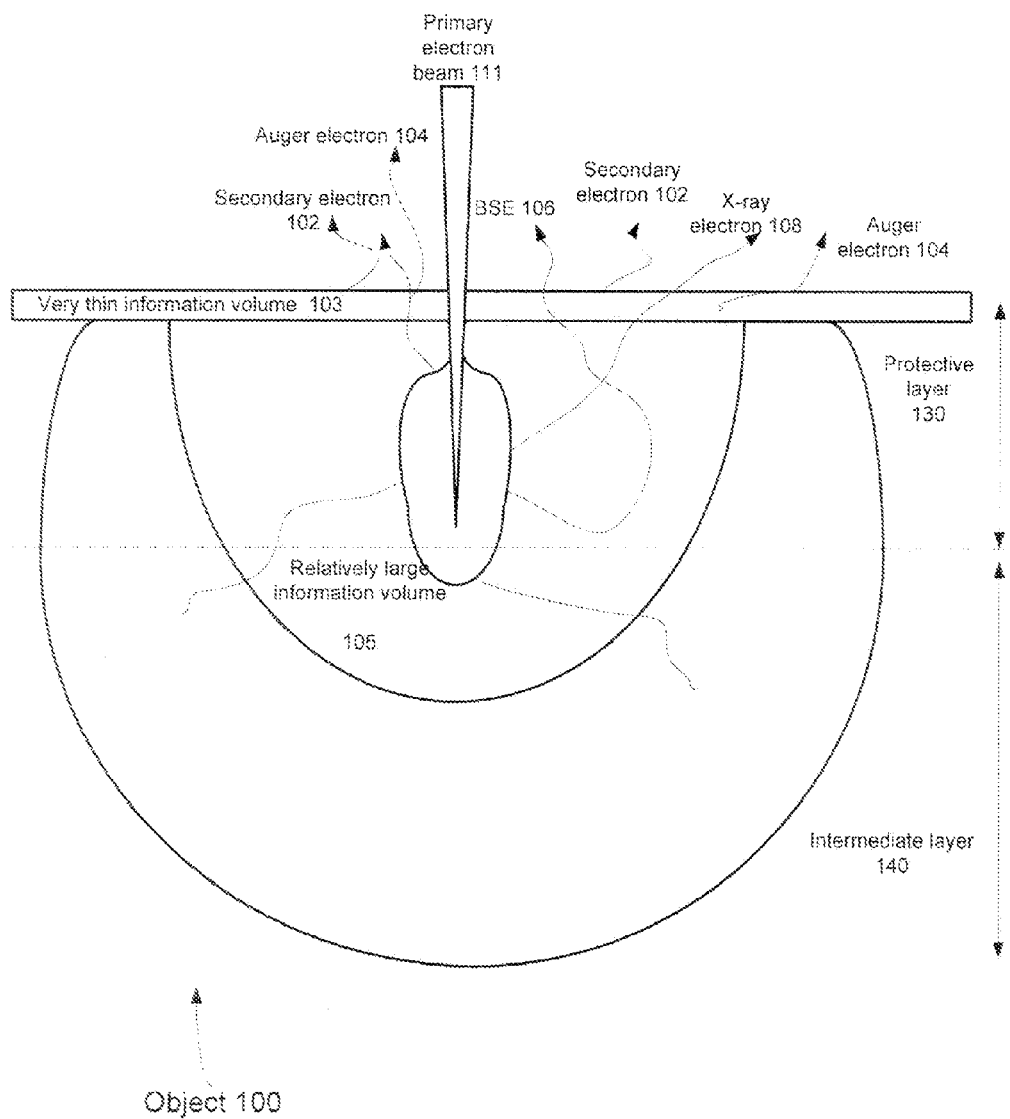
FIG. 2 illustrates the relationship between electron energy and mean free paths of electrons.

FIG. 2 illustrates various interaction processes and various information volumes. An information volume is a space in which an interaction process occurs and result in an emission of X-rays or electrons that may be eventually detected to provide information about the information volume.

The figure illustrates a primary electron beam 111 that hits a sample 100 at an interaction point. As a result, secondary electrons 102 and Auger electrons 104 are emitted from a very thin information volume 103 while back scattered electrons (BSE) 106 and X-rays 108 can leave the inspected object from a large volume that has a depth that may even exceed one micron.

An exemplary protective layer 130 and intermediate layer 140 are also shown. It is noted that FIG. 2 is out of scale and that the relative size of the various volumes and layers can differ from those illustrated in FIG. 2.

It is noted that the distribution of electrons within the information volume is not homogenous. The flux of electrons decreases at longer distance from interaction point.

FIG. 2 also illustrates a secondary electron penetration depth 114 that defines an information from which secondary electrons are omitted. It is noted that electrons such as back-scattered electrons and maximum mean free path electrons 107 are emitted from deeper location within the sample.

Figure 3:
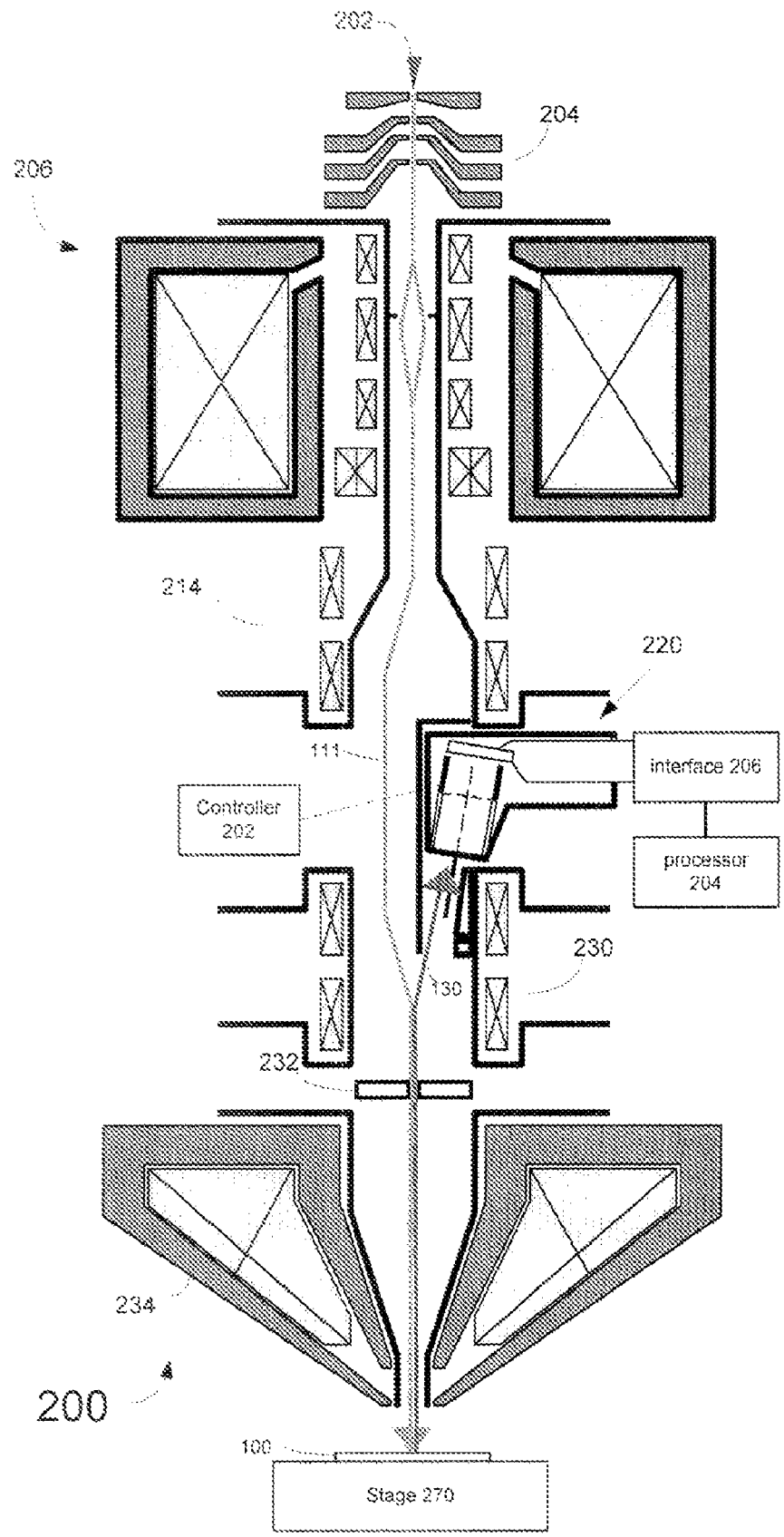
FIG. 3 illustrates a Scanning Electron Microscope (SEM) that may be used for process monitoring, according to an embodiment of the invention.

FIG. 3 illustrates a scanning electron microscope (SEM) 200 that may be utilized for detecting hidden defects, according to an embodiment of the invention.

Scanning electron microscope 200 includes: (i) stage 270, for supporting object 100, the object 100 includes an opaque layer (such as protective layer 130) that positioned above an intermediate layer 140; (ii) controller 202, adapted to receive or define an energy band in response to at least one characteristic of the opaque layer and at least one characteristic of a scanning electron microscope; (iii) illumination optics (that include, for example elements 204, 206, 214, 230 and 234) adapted to illuminate object 100 with primary electron beam 111, (iv) spectrometer 220, controlled by controller 202 such as to selectively reject electrons in response to the defined energy band; and (vii) processor 204 that is adapted to generate images from detection signals provided by the spectrometer.

Figure 7:
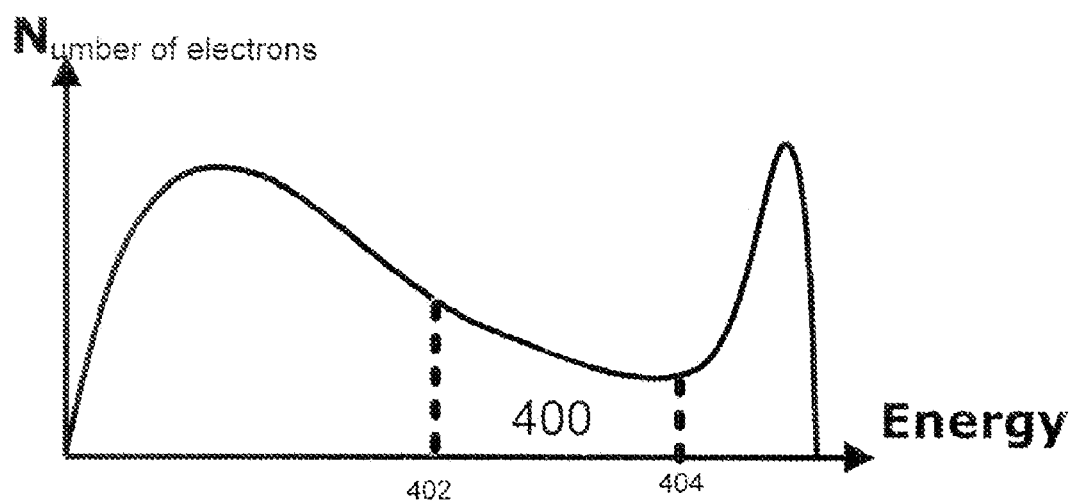
FIG. 7 illustrates an exemplary energy band.

An exemplary energy band 400 is illustrated in FIG. 7. The band includes a minimal energy band level 402 and a maximal energy band level 404. It is noted that in some cases the maximal energy band level is not relevant and all electrons have a kinetic energy above the minimal energy band level 402 are detected by spectrometer 220.

The processor 204 can receive the detection signals after they have been converted from photons to electric signals and then stored in a location (and a format) accessible to the processor 204. This conversion and storage can be executed by interface 206.

SEM 200 includes an electron gun 202 for generating a primary electron beam 111, as well as multiple control and voltage supply units (not shown), a condenser lens 204, a group of lenses 206 that include aperture lens, aperture alignment and a sitgmator. A final aperture is defined between these lenses.

These lenses are followed by four deflectors four additional deflectors 214(1)-214(4) (collectively denoted 214) that cause the primary electron beam 111 to deviate from the optical axis 260 of SEM 200, while propagating in parallel to that axis. This can be achieved by two deflections.

These lenses are followed by four additional deflectors 230(1)-230(4) (collectively denoted 230) that cause the primary electron beam 111 to return to propagate along the optical axis 260 of SEM 200. This can be achieved by two deflections. Each pair of deflectors causes the primary electron beam to de deflected.

These deflectors are followed by an in-lens detector 232 and an objective (as well as electrostatic) lens 234.

It is noted that SEM 200 may include more than a single detector. SEM 200 may include at least one detector positioned in-lens and/or at least one external detector (not shown). SEM 200 may include detectors of various types, such as a secondary electron detector, a backscattered electron detector, a narrowband X-ray detector, and the like. Each detector can include a single sensing element, or may include an array of sensing elements. The detectors may be positioned to detect radiation emitted towards different directions.

In SEM 200 the primary electron beam 111 is directed through an aperture within the in-lens detector 232 to be focused by the objective lens 234 onto an inspected object 100. The primary electron beam 111 interacts with object 100 and as a result various types of electrons and photons, such as secondary electrons, back-scattered electrons, Auger electrons and X-ray quanta are reflected or scattered.

These reflected and scattered electrons (or at least a part of these electrons) form a secondary electron beam that moved upwards towards the in-lens detector 232. Some electrons are detected by the in-lens detector while some propagate towards spectrometer 220.

Figure 4:
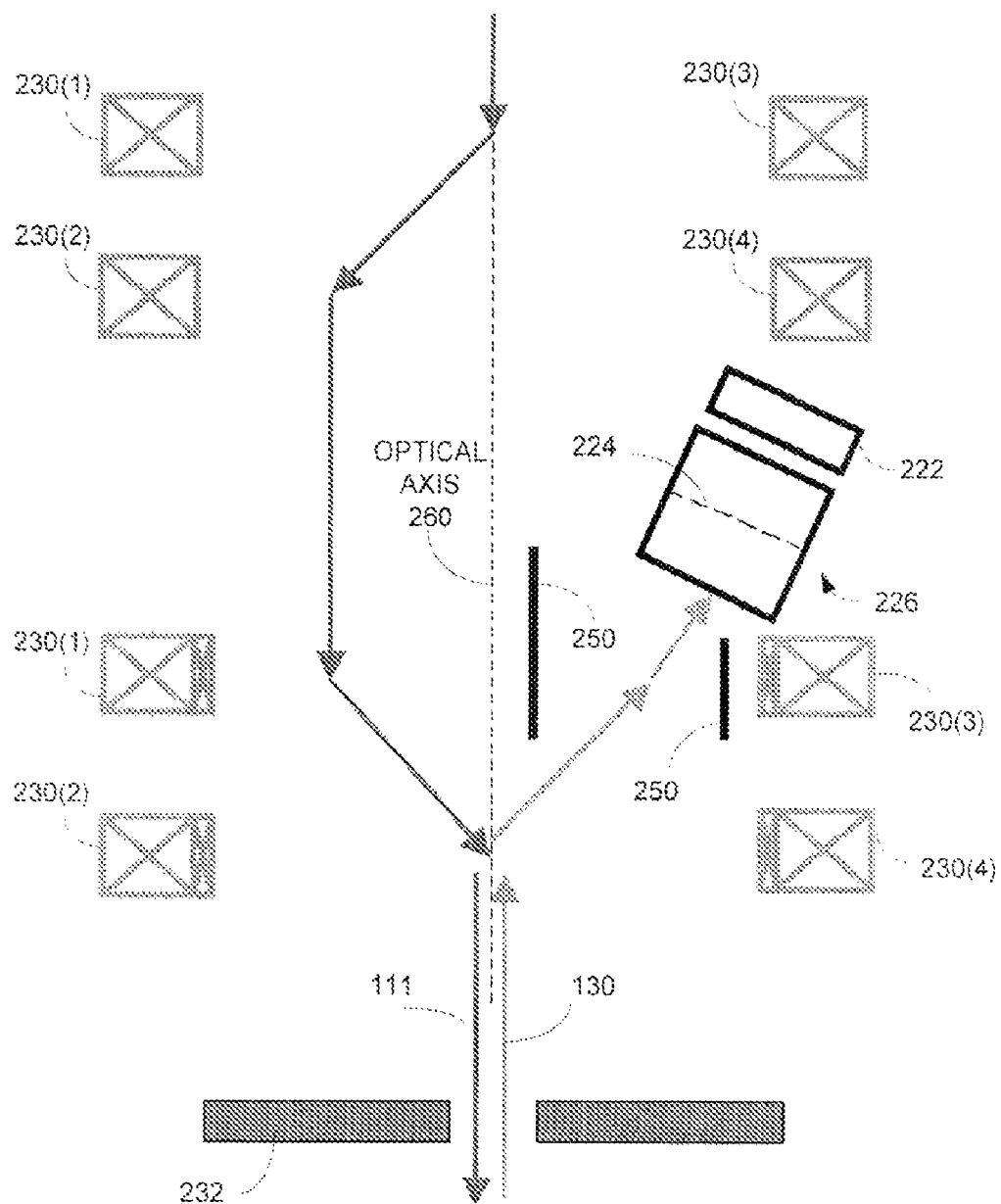
FIG. 4 illustrates the vicinity of the spectrometer, according to an embodiment of the invention.

FIG. 4 illustrates an optional booster 250 that attracts these electrons toward the spectrometer 20. This booster 250 enabled to place a relatively large spectrometer 220 within SEM 200, while positioning it relatively far from the SEM optical axis 260. This distance was introduced in order to reduce the effect of the energy filter 224 within spectrometer 220 on the primary electron beam 111.

It is noted that the separation between the primary and secondary electron beam can be achieved by enhancing the deflection fields applied by deflectors 230 and 214. This can be applied in addition to the booster 250 or instead of such a booster 250.

Figure 5:
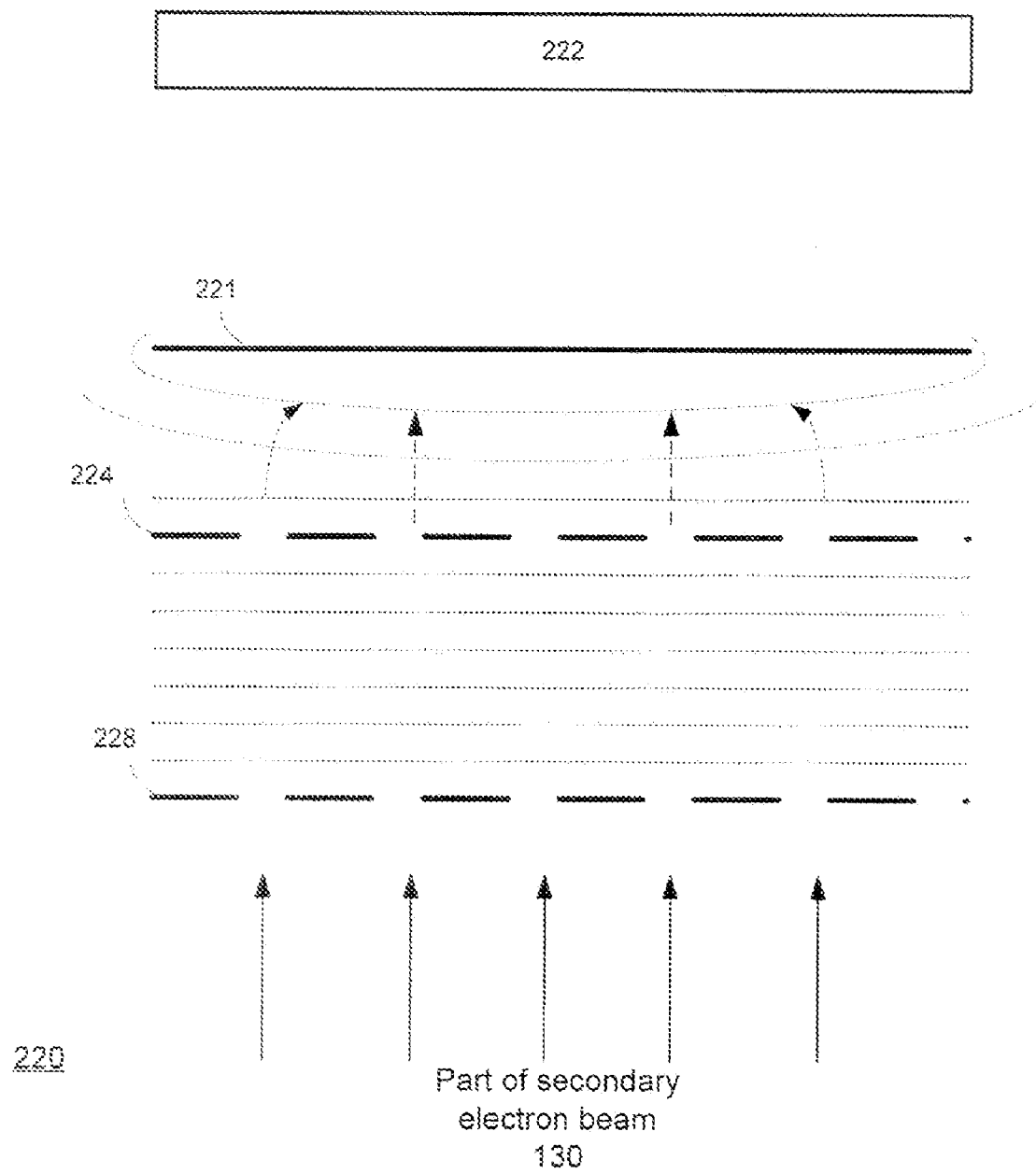
FIG. 5 illustrates the spectrometer, according to an embodiment of the invention.

According to an embodiment of the invention the effect of the energy filter can be reduced by placing an input grid 228 that is set to a potential difference that masks the electrostatic fields introduced by the energy filter grid 224. The inventors set the input grid 228 to the voltage of the column (about 8 Kv till 9 Kv), but other voltages can be applied. This arrangement is illustrated in FIG. 5. Equi-potential lines are illustrated by fine dashed lines. The grids 228 and 224 are illustrated by coarser dashed lines.

FIG. 5 further illustrates the detecting surface 221 of spectrometer 220. This surface 221 emits electrons that are converted to photons by scintillator 222. The light emitted from the scintillator 222 is provided by a light guide (not shown) to a light sensor that provided signals that can be used to generate an image.

The vertical arrows as well as the curved arrows illustrate electrons that arrive to the spectrometer 220. Some propagate towards the detecting surface 221 while others are rejected.

The spectrum of the secondary electron beam or a selected band can be reconstructed by gradually changing the voltage supplied to grid 224.

In order to generate an image of the intermediate layer (and especially its upper surface) the selected energy band 400 is defined by a minimal energy band level 402 and by a maximal energy band level 403.

These energy levels (402 and 404) can be calculated in advance, in view of the material from which the protective layer is made an in view of the operation characteristics (for example voltage difference between the object and the column of SEM 200) of SEM 200. These energy levels can be measured in advance, after various images of the object or a similar object are acquired.

It is noted that the operator can adjust these energy levels by applying different energy levels and monitoring the acquired SEM images.

Electrons that have an energy that is lower than the minimal energy band level 404 are blocked by applying a voltage that corresponds to that minimal energy band level to grid 224. After the grid is set to such a voltage a first (or more) minimal energy band level images are acquired.

In order to filter out the information provided by electrons that have energies that are above the maximal energy band level 404 the grid is set to voltage that corresponds to the maximal energy band level 404. The one or more additional maximal energy band level images are acquired.

Differential images reflecting information conveyed by electrons that have an energy within the energy band are acquired by subtracting one or more maximal energy band level image from one or more corresponding minimal energy band level images.

It is noted that the maximal energy band level 404 can be set in order to receive information from the surface of the intermediate layer and not from locations beneath that surface.

Object 100 is positioned on stage 270. During the process monitoring a relative movement is introduced between object 100 and the primary electron beam 111. This may involve mechanical movement of the object, mechanical movement of other parts of SEM 200 and/or electrical deflection of the beam 111, or a combination of movements and deflection. Typically, the mechanical movement is introduced when a certain target or a certain area are being located, but it may also be introduced while scanning said target or area.

When a certain target or area has to be inspected, there is a need to locate that certain target or area. Various well-known locating processes are known in the art and can be applied. The locating process may include: (i) introducing a mechanical movement towards a vicinity of that certain target or area, (ii) acquiring an image of said vicinity (usually using a field of view that is derived from mechanical movement inaccuracies) by scanning said vicinity within an acquisition window, (iii) processing the image to locate the target or area (for example, comparing a target by comparison with a previously acquired target image) to locate the target or area. Usually, once the location process ends the images of the area are acquired by scanning it with a scanning window that is usually much smaller than the acquisition window.

Figure 6:
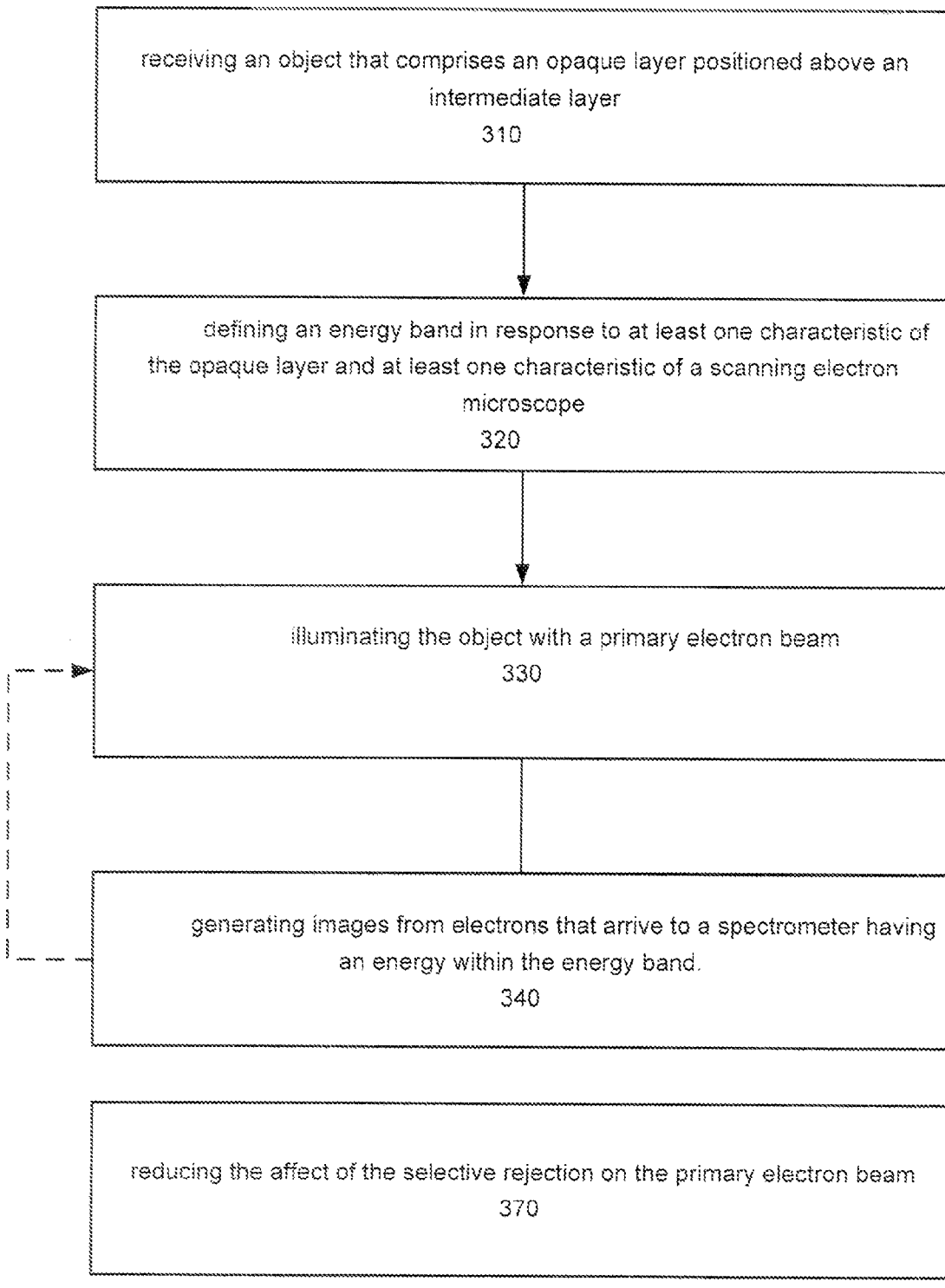
FIG. 6 illustrates a method for detecting hidden defects, according to an embodiment of the invention.

FIG. 6 illustrates method 300 for detecting hidden defects, according to an embodiment of the invention.

Method 300 starts by stage 310 of receiving an object that comprises an opaque layer positioned above an intermediate layer.

Stage 310 is followed by stage 320 of defining an energy band in response to at least one characteristic of the opaque layer and at least one characteristic of a scanning electron microscope. It is noted that stage 320 can precede stage 310 and that the definition can be applied to multiple objects.

Stage 320 is followed by stage 330 of illuminating the object with a primary electron beam. This stage can include locating a certain area or target.

Stage 330 is followed by stage 340 of generating images from electrons that arrive to a spectrometer having an energy within the energy band.

Conveniently, stage 340 can include adjusting the energy band in response to one or more generated images.

Stage 320 can include defining the energy band responsive to the material from which the opaque layer is made of and to a thickness of the opaque layer.

Stage 340 conveniently includes selectively rejecting electrons based upon their energy.

Method 300 can further include stage 370 of reducing the affect of the selective rejection on the primary electron beam. Stage 370 can be applied during stages 330-340. Stage 370 can include attracting secondary electrons towards a spectrometer by applying an attraction field. Stage 370 may include placing an input grid at the input of a spectrometer and setting the grid to a voltage that corresponds to the voltage of the environment of the spectrometer, and especially to the voltage of the SEM column. Stage 370 may also include separating between the primary electron beam and a secondary electron beam formed from an interaction between the primary electron beam and the object.

According to an embodiment of the invention the energy band is defined by a minimal energy band level. It can also be defined by a maximal energy band level, although this is not necessarily so.

Conveniently, stage 340 includes generating minimal energy band level images. According to an embodiment of the invention stage 340 includes generating maximal energy band level images. Conveniently, stage 340 includes generating minimal energy band level images, generating maximal energy band level images and subtracting the maximal energy band level images from the minimal energy band level images to provide the images from electrons that arrive to a spectrometer having an energy within the energy band.

The present invention can be practiced by employing conventional tools, methodology and components. Accordingly, the details of such tools, components and methodology are not set forth herein in detail. In the previous descriptions, numerous specific details are set forth, such as shapes of cross sections of typical lines, amount of deflection units, etc., in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

We claim:

1. A method for detecting hidden defects, the method comprising the stages of:
    receiving an object that comprises an opaque layer positioned above an intermediate layer;
    defining an energy band in response to at least one characteristic of the opaque layer and at least one characteristic of a scanning electron microscope, wherein the energy band defines a spectral range of energy levels of secondary electrons;
    adjusting a voltage supplied to an input grid of a spectrometer such that secondary electrons with energy levels within the spectral range of the energy band are accepted by a spectrometer;
    illuminating the object with a primary electron beam;
    receiving secondary electrons of various energy levels the spectrometer, wherein the secondary electrons are formed by an interaction between the primary electron beam and the object;
    selectively accepting, by the spectrometer via the input grid, a portion of the received secondary electrons with energy levels that are within the spectral range of the energy band;
    generating an image from secondary electrons accepted by the spectrometer.

2. The method according to claim 1 further comprising:
    analyzing the generated image;
    adjusting the spectral range of the energy band in response to the analysis; and
    adjusting the voltage supplied to the input grid responsively to the adjustment in the spectral range of the energy band.

3. The method according to claim 1, wherein the defining is responsive to a composition and thickness of the opaque layer.

4. The method according to claim 1, further comprising:
    attracting secondary electrons towards the spectrometer by applying an attraction field to the input grid.

5. The method according to claim 1, further comprising:
    applying a deflection field to at least one of the primary electron beam and a beam formed by secondary electrons thereby separating a trajectory of the primary electron beam and a trajectory of the beam formed by the secondary electrons.

6. The method according to claim 1, wherein the image is generated with secondary electrons with a minimal level of energy within the spectral range of the energy band.

7. The method according to claim 1, wherein the image is generated with secondary electrons with a maximum level of energy within the spectral range of the energy band.

8. The method according to claim 1, wherein generating comprises generating a first image with secondary electrons with a minimal level of energy within the spectral range of the energy band and generating a second image with secondary electrons with a maximum level of energy within the spectral range of the energy band, and the method further includes generating a differential image by subtracting the second image from the first image.

9. A scanning electron microscope, comprising:
    a stage for supporting an object that comprises an opaque layer positioned above an intermediate layer;
    a controller, adapted to at least one of receive and define an energy band in response to at least one characteristic of the opaque layer and at least one characteristic of a scanning electron microscope, wherein the energy band defines a spectral range of energy levels of secondary electrons;
    illumination optics adapted to illuminate the object with a primary electron beam;
    a spectrometer, wherein the spectrometer is adapted to receive secondary electrons of various energy levels, wherein the secondary electrons are formed by an interaction between the primary electron beam and object, the spectrometer including:
        an input grid wherein a voltage supplied to the input grid is controlled by the controller such that secondary electrons with energy levels within the spectral range of the energy band are accepted by a spectrometer; and
    a processor that is adapted to generate an image from detection signals provided by the spectrometer.

10. The scanning electron microscope of claim 9, wherein the processor is further adapted to analyze the generated image and the controller is further adapted to adjust the spectral range of the energy band in response to the analysis and adjust the voltage supplied to the input grid responsively to the adjustment in the spectral range of the energy band.

11. The scanning electron microscope of claim 9, wherein the controller is adapted to define the energy band in response to a composition and thickness of the opaque layer.

12. The scanning electron microscope of claim 9 further comprising:
    a booster adapted to attract secondary electrons towards the spectrometer.

13. The scanning electron microscope of claim 9 further comprising:
    multiple deflectors adapted to apply a deflection field that acts to separate a trajectory of the primary electron beam and a trajectory of a beam formed by the secondary electrons.

14. The scanning electron microscope of claim 9, wherein the processor is further adapted to generate an image from secondary electrons with a minimal level of energy within the spectral range of the energy band.

15. The scanning electron microscope of claim 9, wherein the processor is further adapted to generate an image from secondary electrons with a maximum level of energy within the spectral range of the energy band.

16. The scanning electron microscope of claim 9, wherein the processor is further adapted to generate an image with secondary electrons with a minimal level of energy within the spectral range of the energy band, generate an image with secondary electrons with a maximum level of energy within the spectral range of the energy band, and generate a differential image by subtracting the image generated with the secondary electrons with the maximum level of energy from the image generated with the secondary electrons with the minimum level of energy.

17. The method of claim 1, wherein selectively accepting the portion of secondary electrons by the spectrometer comprises:
filtering out secondary electrons with energy levels that do not fall within the spectral range of the energy band, wherein the filtering does not substantially affect the primary electron beam.

18. The method of claim 1, wherein selectively accepting the portion of secondary electrons by the spectrometer comprises:
attracting the portion of secondary electrons to the spectrometer with a booster.

19. The scanning electron microscope of claim 9, further comprising:
a filter for filtering out secondary electrons with energy levels that do not fall within the spectral range of the energy band, wherein the filtering does not substantially affect the primary electron beam.

* * * * *